(12) United States Patent
Bao et al.

(10) Patent No.: US 12,308,799 B2
(45) Date of Patent: May 20, 2025

(54) POWER AMPLIFIER ARRANGEMENT COMPRISING RUTHROFF TRANSFORMER

(71) Applicant: Telefonaktiebolaget LM Ericsson (publ), Stockholm (SE)

(72) Inventors: Mingquan Bao, Västra Frölunda (SE); Sven Mattisson, Lomma (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 571 days.

(21) Appl. No.: 17/626,418

(22) PCT Filed: Jul. 11, 2019

(86) PCT No.: PCT/SE2019/050688
§ 371 (c)(1),
(2) Date: Jan. 11, 2022

(87) PCT Pub. No.: WO2021/006782
PCT Pub. Date: Jan. 14, 2021

(65) Prior Publication Data
US 2022/0321061 A1    Oct. 6, 2022

(51) Int. Cl.
*H03F 1/07* (2006.01)
*H03F 1/02* (2006.01)
*H03F 3/24* (2006.01)

(52) U.S. Cl.
CPC .......... *H03F 1/0288* (2013.01); *H03F 3/245* (2013.01); *H03F 2200/451* (2013.01); *H03F 2200/541* (2013.01)

(58) Field of Classification Search
CPC ................................. H03F 1/02; H03F 1/07
(Continued)

(56) References Cited

U.S. PATENT DOCUMENTS

| 3,037,175 A | 5/1962 | Ruthroff |
| 8,577,313 B2 * | 11/2013 | Sorrells ..................... H03C 5/00 455/127.1 |

(Continued)

FOREIGN PATENT DOCUMENTS

WO    2015108492 A1    7/2015

OTHER PUBLICATIONS

International Search Report and the Written Opinion of the International Searching Authority, issued in corresponding International Application No. PCT/SE2019/050688, dated Mar. 6, 2020, 10 pages.
(Continued)

*Primary Examiner* — Henry Choe
(74) *Attorney, Agent, or Firm* — Rothwell, Figg, Ernst & Manbeck, P.C.

(57) ABSTRACT

There is provided a power amplifier arrangement for amplifying an input power signal to an output power signal. The power amplifier arrangement comprises a main amplifier having an input and an output. The power amplifier arrangement comprises at least one auxiliary amplifier, each having an input and an output. The power amplifier arrangement comprises a power divider having an input and outputs. The input of the power divider is configured to receive the input power signal. Each output of the power divider is connected to a respective input of the power amplifiers. The power amplifier arrangement comprises a Doherty combiner comprising at least one Ruthroff transformer and configured to combine all the outputs of the power amplifiers to, at an output of the Doherty combiner, produce the output power signal.

17 Claims, 7 Drawing Sheets

(58) Field of Classification Search
USPC ............................................. 330/124 R, 295
See application file for complete search history.

(56) References Cited

U.S. PATENT DOCUMENTS

| | | | |
|---|---|---|---|
| 8,988,161 | B2 | 3/2015 | Campbell |
| 9,768,733 | B2* | 9/2017 | Sorrells ................. H03F 1/0205 |
| 10,122,328 | B2* | 11/2018 | Roberg .................... H03H 7/38 |
| 2006/0006939 | A1 | 1/2006 | Burns et al. |
| 2006/0044060 | A1 | 3/2006 | Shiikuma |
| 2009/0115512 | A1 | 5/2009 | Grondahl et al. |
| 2010/0019857 | A1 | 1/2010 | McMorrow et al. |
| 2012/0286861 | A1 | 11/2012 | Bowles et al. |
| 2014/0184339 | A1 | 7/2014 | Gomez et al. |
| 2018/0082778 | A1 | 3/2018 | Roberg |
| 2018/0191325 | A1 | 7/2018 | Leoni et al. |

OTHER PUBLICATIONS

V. Vorapipat, et al "A class-G voltage-mode Doherty power amplifier", IEEE Journal of Solid-State Circuits, vol. 52, No. 12, Dec. 2017, pp. 3348-3360.

D. Chen et al. "A V-band Doherty power amplifier based on voltage combination and balance compensation marchand balun", IEEE Access, 2018, pp. 10131-10138.

E. Kaymaksut, et al. "Transformer-based Doherty power amplifiers for mm-wave applications in 40-nm CMOS", IEEE Transactions on Microwave Theory and Techniques, vol. 63, No. 4, pp. 1186-1192, Apr. 2015.

P. Saad et al. "A 1.8-3.8-GHz Power Amplifier With 40% Efficiency at 8-dB Power Back-Off", IEEE Transactions on Microwave Theory and Techniques, vol. 66, No. 11, Nov. 2018, pp. 4870-4882.

C. L. Ruthroff "Some broad-band transformers," Proc. IRE, vol. 47, pp. 1337-1342, Aug. 1959.

W. F. Bodtmann et al. "A wideband transistor IF amplifier for space and terrestrial repeaters using grounded-base transformer-coupled stages,", The Bell System Technical Journal, vol. 42 , No. 1, 1963, pp. 37-54.

H.-K. Chiou et al. "Broadband and High-Efficiency Power Amplifier that Integrates CMOS and IPD Technology", IEEE Transactions on Components, Packaging and Manufacturing Technology, vol. 3, No. 9, Sep. 2013, pp. 1489-1497.

C. F. Campbell "GaN non-uniform distributed power amplifier MMICs—the highs and lows (invited)", IEEE Compound Semiconductor Integrated Circuit Symposium (CSICS), 2017, 4 pages.

H.-K. Chiou et al. "Broadband and low-loss 1:9 transmission line transformer in 0.18-μm CMOS process," IEEE Electron Devices Lett., vol. 31, No. 9, pp. 921-923, Sep. 2010.

Chung et al. "Broadband and Low-loss Ruthroff-type Transmission Line Transformer in Integrated Passive Devices Technology" IEEE, 2012, 3 pages.

Nguyen et al. "4.6 A mm-Wave 3-Way Linear Doherty Radiator with Multi-Antenna Coupling and On-Antenna Current-Scaling Series Combiner for Deep Power Back-Off Efficiency Enhancement" IEEE International Solid-State Circuits Conference, 2019, pp. 84-86.

Kim et al. "6-18 GHz, 26 W GaN HEMT compact power-combined non-uniform distributed amplifier" Electronics Letters, Dec. 8, 2016, vol. 52, No. 25, pp. 2040-2042.

\* cited by examiner

POWER AMPLIFIER ARRANGEMENT COMPRISING RUTHROFF TRANSFORMER

CROSS REFERENCE TO RELATED APPLICATION(S)

This application is a 35 U.S.C. § 371 National Phase Entry Application from PCT/SE2019/050688, filed Jul. 11, 2019, designating the United States, the disclosure of which is incorporated herein by reference in its entirety.

TECHNICAL FIELD

Embodiments presented herein relate to a power amplifier arrangement. Embodiments further relate to a radio transceiver device comprising such a power amplifier arrangement.

BACKGROUND

In general terms, an electronic amplifier is an electronic device used to increase the magnitude of voltage/current/power of an input signal. It takes in a weak electrical signal/waveform and reproduces a similar stronger waveform at the output by using an external power source. A power amplifier is an electronic amplifier designed to increase the magnitude of power of a given input signal. The power of the input signal is increased to a level high enough to drive loads of output devices like speakers, headphones, antennas, etc.

The Doherty power amplifier (DPA) is able to provide a means of linearity whilst being able to provide a significant improvement in efficiency. The Doherty power amplifier achieves high efficiency by having two, or more, amplifier sections. One amplifier section comprising a main amplifier provides for the all amplitude signal situations. A second amplifier section comprising one or more auxiliary amplifiers, is then brought in to use in high input power, to provide the capability to meet the higher-level signals conditions without running into compression. If more than two amplifiers are employed, subsequent amplifiers are engaged as the signal level increases. In this way the Doherty amplifier is able to provide linearity and efficiency The Doherty power amplifier thus commonly comprises a main amplifier and at least one auxiliary amplifier. The Doherty power amplifier thereby has a high power added efficiency (PAE) not only at the saturated output power ($P_{sat}$) but also at a power level several dBs below $P_{sat}$ (typically 6-10 dB below $P_{sat}$). This lower power level is said to be at the power back-off (OBO) level.

In the Doherty power amplifier, the outputs of the main amplifier and the one or more auxiliary amplifiers are combined by a network which is called Doherty combiner. In low-input-power region, only the main amplifier is in the "on" state and reaches a maximum efficiency at OBO power level. In the high-input-power region, where both the main amplifier and the one or more auxiliary amplifiers are active, the load presented to the main amplifier is modulated by the one or more auxiliary amplifiers, i.e. the main amplifier sees a lower load impedance, resulting in maintained high efficiency operation over a large output power range.

The Doherty combiner is commonly composed of a quarter wavelength transmission line (i.e., a transmission line having the length of one quarter of the wavelength of the carrier frequency of the signal to be amplified by the power amplifier). The Doherty combiner might also be composed of two transformers connected in series. The latter could enable the Doherty power amplifier to operate at high frequency (such as for frequencies above 30 GHz). There has also been proposed a Doherty combiner composed of several transmission lines to obtain an ultra-wide bandwidth Doherty power amplifier.

However, all Doherty combiners tend to occupy a large physical area, and in addition to improve performance, there is thus still a need for reducing the size of the power amplifier arrangements.

SUMMARY

An object of embodiments herein is to provide an improved power amplifier arrangement.

According to a first aspect there is presented a power amplifier arrangement for amplifying an input power signal to an output power signal. The power amplifier arrangement comprises a main amplifier having an input and an output. The power amplifier arrangement comprises at least one auxiliary amplifier, each having an input and an output. The power amplifier arrangement comprises a power divider having an input and outputs. The input of the power divider is configured to receive the input power signal. Each output of the power divider is connected to a respective input of the amplifiers. The power amplifier arrangement comprises a Doherty combiner comprising at least one Ruthroff transformer and configured to combine all the outputs of the amplifiers to, at an output of the Doherty combiner, produce the output power signal.

Advantageously this power amplifier arrangement is enabled to operate over a wide frequency bandwidth.

Advantageously, the Doherty combiner based on Ruthroff transformers provide a DC path for the drains of all transistors. It also enables a compact design of the power amplifier arrangement, compared to a Doherty combiner consisting of one or more quarter-wavelength transmission lines.

According to a second aspect there is presented a radio transceiver device comprising at least one power amplifier arrangement according to the first aspect.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, step, etc." are to be interpreted openly as referring to at least one instance of the element, apparatus, component, means, module, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

As noted above there is a need for improved power amplifier arrangements.

Firstly, for existing power amplifiers the output power combiner consists of quarter wavelength transmission lines, which occupy a large chip area. The power combiner is, thus, expansive to be implemented in an Integrated Circuit (IC), an Integrated Module (IM), or a Monolithic Microwave Integrated Circuit (MMIC) chip. Furthermore, a low characteristic impedance transmission line is also too wide to be implemented on-chip.

Secondly, each auxiliary amplifier must be matched to the admittance difference between neighboring transmission lines. The admittance difference of the transmission lines is realized by changing the widths of the transmission lines. However, the variation of the width of the transmission lines has limitation. The transmission lines cannot be too narrow or too wide. This limitation could limit the choice of the transistor size associated with the required intrinsic load for the transistors in the power amplifier to deliver their peak output power.

The inventors of the present embodiments have realized that in a single-stage power amplifier, the impedance matching to the load is of importance. Of course, the present embodiments can be used in a multi-stage power amplifier. The inventors of the present embodiments have further realized that Ruthroff transformer can be utilized for both impedance matching and power combining. Ruthroff transformer realizes ideally a 1:4 impedance transformation based on a transformer with a turns ratio of 1:1, which has a wide frequency bandwidth.

The embodiments disclosed herein therefore relate to a power amplifier arrangement, and in particular to a power amplifier arrangement comprising a Doherty combiner, in turn comprising at least one Ruthroff transformer.

Figure 1:
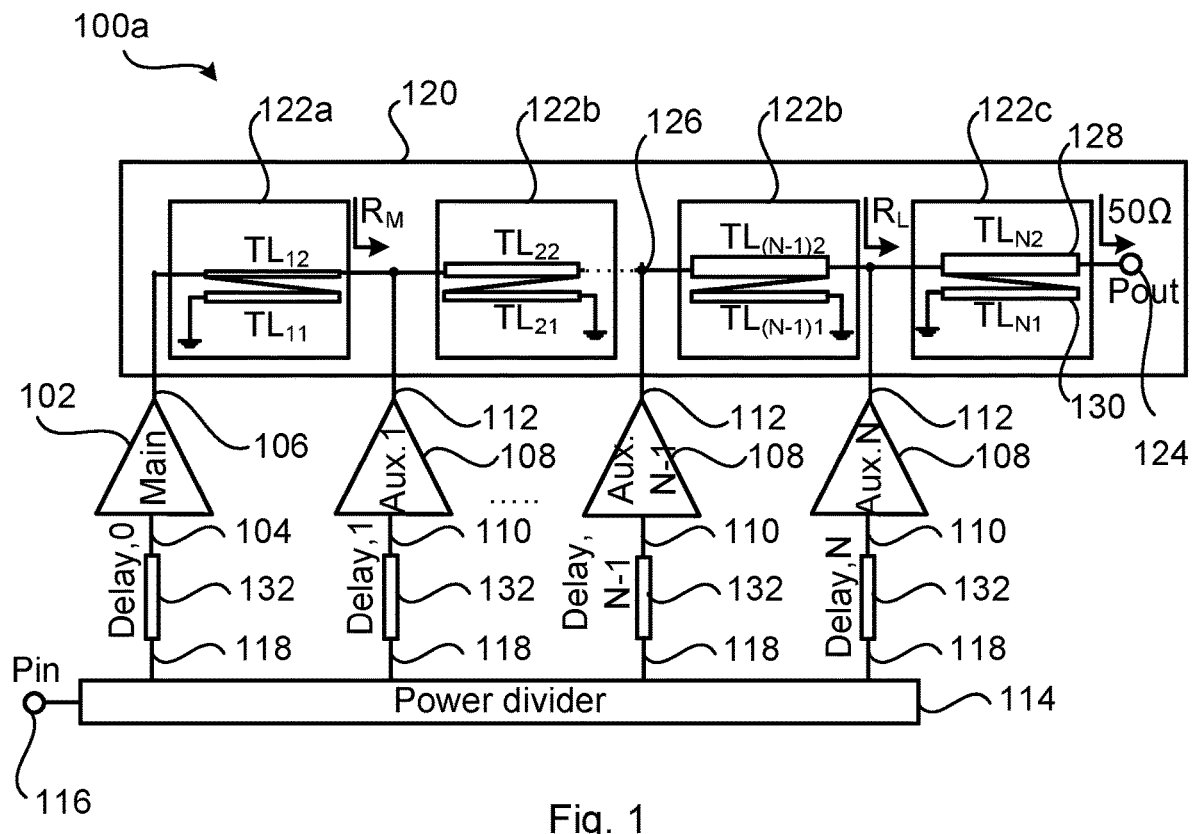
FIGS. 1, 2, and 9 schematically illustrate power amplifier arrangements according to embodiments.

Reference is made to FIG. 1 illustrating such a power amplifier arrangement bow according to embodiments for amplifying an input power signal Pin to an output power signal Pout.

The power amplifier arrangement bow comprises a main amplifier 102 having an input 104 and an output 106.

The power amplifier arrangement bow further comprises at least one auxiliary amplifier 108, each having an input 110 and an output 112.

The power amplifier arrangement bow further comprises a power divider 114 having an input 116 and outputs 118. The input 116 of the power divider 114 is configured to receive the input power signal Pin. Each output 118 of the power divider 114 is connected to a respective input 104, 110 of the power amplifiers 102, 108.

The power amplifier arrangement bow further comprises a Doherty combiner 120. The Doherty combiner 120 comprises at least one Ruthroff transformer 122a, 122b, 122c. The Doherty combiner 120 is configured to combine all the outputs 106, 112 of the main and auxiliary amplifiers 102, 108 to, at an output 124 of the Doherty combiner 120, produce the output power signal Pout.

Embodiments relating to further details of the power amplifier arrangement will now be disclosed.

In FIG. 1 is illustrated an embodiment of a power amplifier arrangement 100a where the Doherty combiner 120 is made up of serval cascaded Ruthroff transformers. That is, according to an embodiment, the Doherty combiner 120 comprises cascaded Ruthroff transformers. The main amplifier is connected to the first Ruthroff transformer. That is, according to an embodiment, one Ruthroff transformer 122a is connected between the output 106 of the main amplifier 102 and the output 112 of one of the auxiliary amplifiers 108. The first Ruthroff transformer transfers a low output impedance of the main amplifier to a higher output impedance and thus provides an upward impedance transformation. That is, according to an embodiment, the Ruthroff transformer 122a connected to the main amplifier 102 is configured to provide an upward impedance transformation. The outputs of the auxiliary amplifiers are connected separately to the junctions between two neighboring Ruthroff transformers. That is, according to an embodiment, the cascaded Ruthroff transformers are separated by junctions 126. The output 106 of the main amplifier 102 is connected to the first cascaded Ruthroff transformer. The output 112 of each auxiliary amplifier 108 is connected to a respective one of the junctions 126 between two neighboring cascaded Ruthroff transformers. The second, the third, up to the $N^{th}$ Ruthroff transformer realize a downward impedance transformation, and the low impedance ports of the Ruthroff transformers are located towards the load. That is, according to an embodiment, each cascaded Ruthroff transformer 122b except the first cascaded Ruthroff transformer 122a and the last cascaded Ruthroff transformer 122c is configured to provide a downward impedance transformation. The $N^{th}$ Ruthroff transformer is connected between the last auxiliary amplifier and the load. That is, according to an embodiment, one Ruthroff transformer 122c is connected between the output 112 of an auxiliary amplifier 108 and the output 124 of the Doherty combiner 120. The $N^{th}$ Ruthroff transformer provides an upward impedance transformation for the 50Ω load. That is, according to an embodiment, the Ruthroff transformer 122c connected to the output 124 of the Doherty combiner 120 is configured to provide an upward impedance transformation.

In the example of FIG. 1 there are as many Ruthroff transformers as there are main and auxiliary amplifiers. That is, according to an embodiment, there are as many cascaded Ruthroff transformers as there are main and auxiliary amplifiers 102, 108 in total.

Figure 2:
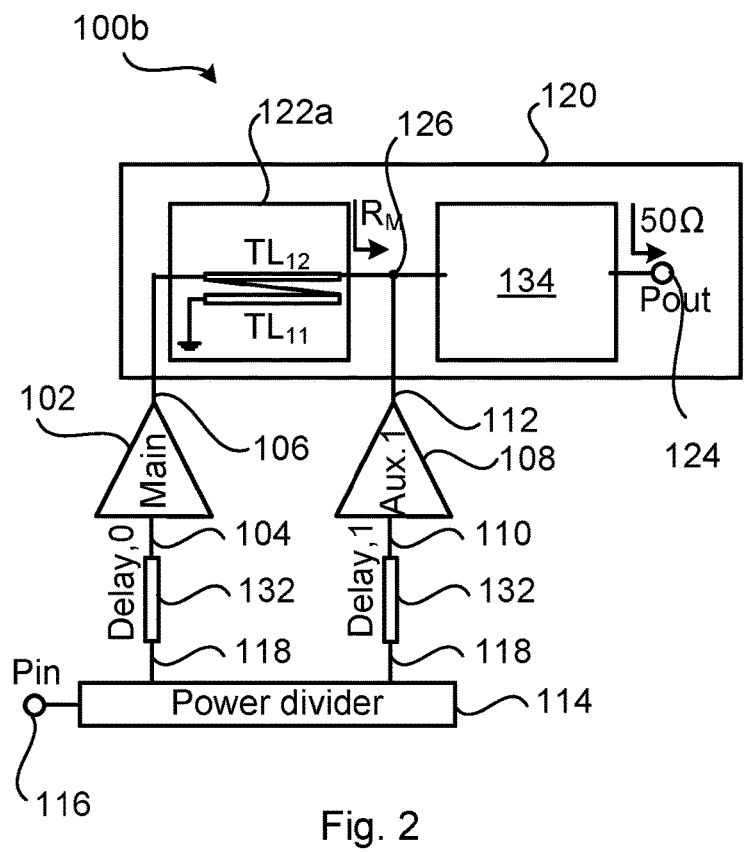

In some examples the last auxiliary amplifier 108 is connected to the output 124 of the Doherty combiner 120 via an impedance matching network. FIG. 2 illustrates an embodiment of such a power amplifier arrangement mob. That is, according to an embodiment, the power amplifier arrangement further comprises an impedance matching network 134, where the impedance matching network 134 is connected between the output 112 of one auxiliary amplifier 108 and the output 124 of the Doherty combiner 120.

It is noted that the illustrative examples of FIG. 1 and FIG. 2 can be combined, such that the Doherty combiner 120 comprises cascaded Ruthroff transformers but where the $N^{th}$ Ruthroff transformer of FIG. 1 replaced by the impedance matching network 134 of FIG. 2.

Further, the inputs 104, 110 of all the power amplifiers 102, 108 might be connected to the outputs 114 of the power divider 114 via respective phase delay lines 132 to drive each power amplifier in terms of proper phase and amplitude.

The load impedance, $R_L$, is determined according to:

$$R_L = \frac{(V_{dd} - V_k)^2}{2P_{out}} \quad (1)$$

where $V_{dd}$ is transistor drain supply voltage, $V_k$ is transistor knee voltage, and $P_{out}$ is the peak output power. Because $R_L$ is usually less than 50Ω, the $N^{th}$ Ruthroff transformer 122c can be used to match $R_L$ to a 50Ω load.

The load, $R_M$, seen by the main amplifier 102 is determined according to:

$$R_M = R_L \cdot 10\left(\frac{OBO}{10}\right) \quad (2)$$

For an OBO of 6 dB, $R_M=3.16 \cdot R_L$. For an OBO of 8 dB, $R_M=6.31 \cdot R_L$. The $1^{st}$ Ruthroff transformer 122a is used to match $R_{opt}$ of the main amplifier 102 to $R_M$ in order to achieve upward impedance matching.

The remaining Ruthroff transformers 122b (the $2^{nd}$ to the $N^{th}$) combine the output powers from the auxiliary amplifiers 108, provide output matching for each auxiliary amplifier, and realize impedance transformation from $R_L$ to $R_M$, as shown in FIG. 1.

Moreover, a Doherty combiner comprising at least one Ruthroff transformer might be optimized to absorb the output parasitic capacitance of the main amplifier and of the at least one auxiliary amplifier which are connected directly with the Doherty combiner without any output matching network.

Figure 3:
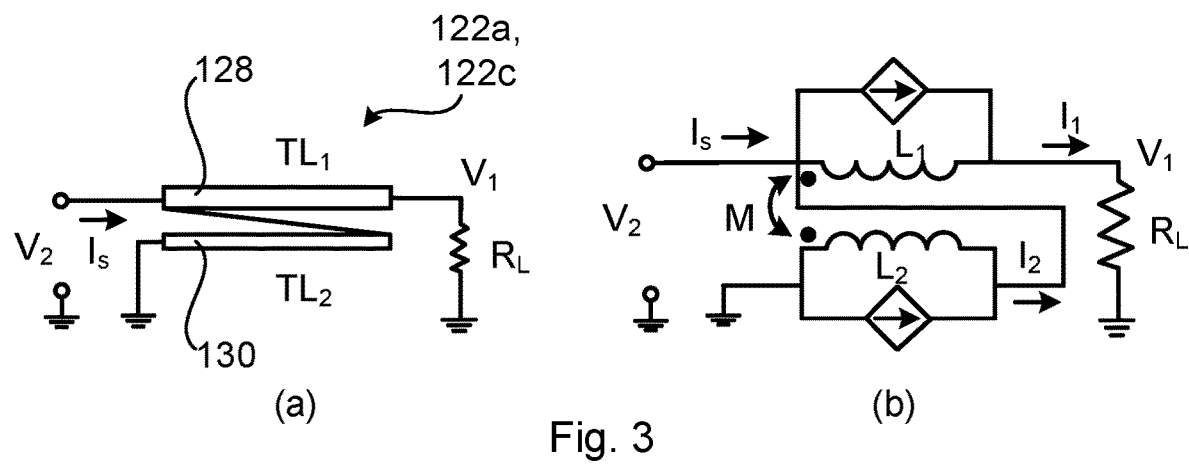
FIGS. 3, 6, 7, and 8 schematically illustrate Ruthroff transformers and their circuit diagrams according to embodiments.

A Ruthroff transformer might be implemented as two coupled transmission lines, as shown in FIG. 3(a). That is, according to an embodiment, each of the at least one Ruthroff transformer 122a, 122b, 122c consists of two coupled transmission lines 128, 130. Since the lengths of coupled transmission lines in most practical cases can be selected to be much shorter than the wavelength of the signal to be input to the power amplifier arrangement, the coupled transmission lines can be represented by a coupled inductors pair with self-inductances $L_1$ and $L_2$, as well as a mutual inductance $M=k\sqrt{L_1 L_2}$, where, k represents the coupling factor.

The length of the transmission lines is much less than a quarter wavelength, thus allowing for a compact design of the power amplifier arrangement. The Ruthroff transformer provides several parameters to be tuned, for example, the separation of the two coupled transmission lines, the length and the width of the transmission lines. This allows for easy realization of the impedance matching.

According to an embodiment, the two coupled transmission lines 128, 130 exhibit an impedance transformation ratio, n. The impedance transformation ratio is determined by the separation distance between the two coupled transmission lines 128, 130 as well as the length and the width of each transmission line 128, 130. The impedance transformation ratio for each of the at least one Ruthroff transformer 122a, 122b, 122c is selected according to an impedance matching criterion for the main and auxiliary amplifiers 102, 108 connected to each of the at least one Ruthroff transformer 122a, 122b, 122c. In more detail, the impedance transformation ratio between the high impedance port to the low impedance one (n≥1) is defined as $$n = \frac{R_L}{Z_{22}},$$

where $R_L$ is load at the high impedance port, and $$Z_{22} = \frac{V_2}{I_s}$$

is the impedance at the low impedance port. The low impedance port is connected with one terminal of the other winding. FIG. 3(b) shows the equivalent circuit of the Ruthroff transformer.

Based on the equivalent circuit of a pair of coupled inductors, as well as Kirchhoff's current and voltage laws, the following is obtained:

$$\begin{bmatrix} \frac{1}{sL_1} + \left(1+\frac{M}{L_1}\right)\frac{1}{R_L} & -\frac{1}{sL_1} \\ -\left(1+\frac{M}{L_2}\right)\frac{1}{sL_1} & \left(1+\frac{M}{L_2}\right)\frac{1}{sL_1} + \left(1+\frac{M}{L_1}\right)\frac{1}{sL_2} \end{bmatrix} \begin{bmatrix} V_1 \\ V_2 \end{bmatrix} = I_s \begin{bmatrix} \frac{M}{L_1} \\ 1-k^2 \end{bmatrix} \quad (3)$$

where s=jω. For simplicity, and without loss of generality, we assume $L_1=L_2$, and obtain the impedance $$Z_{22} = \frac{V_2}{I_s} = R_L \frac{1+(1-k^2)\frac{sL}{R_L}}{1+2(1+k)\frac{sL}{R_L}} \cdot \frac{sL}{R_L} \quad (4)$$

From (4), it can be found that the impedance transformation ratio $$n = \frac{R_l}{Z_{22}}$$

is a function of k and $$\frac{sL}{R_L}.$$

Figure 4:
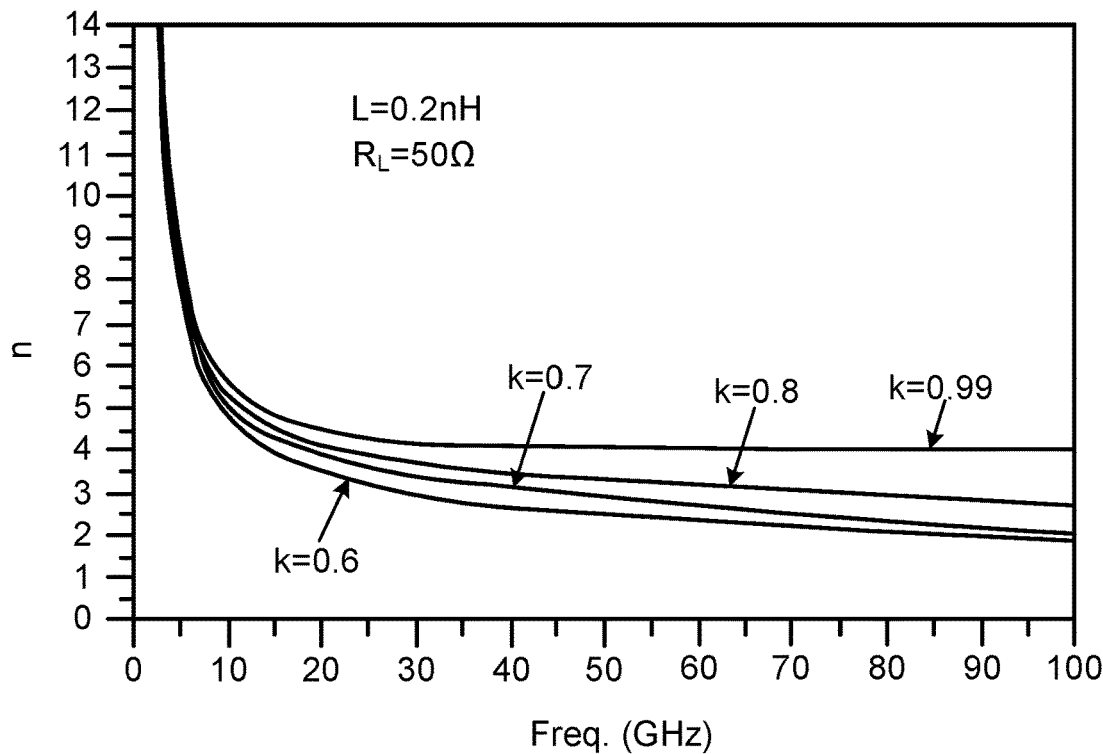
FIGS. 4, 5, 10, 11, 12, 13 illustrate results.

In FIG. 4 the magnitude of the impedance transformation ratio n versus frequencies is plotted at different k, when $$\frac{L}{R_L}$$

is fixed. When k is equal to 1 (or close thereto), the magnitude of the impedance transformation ratio n is equal to 4, in a wide frequency range (f≥30 GHz). The variation of n versus frequency increases with increasing k. The impedance transformation ratio n decreases with decreasing coupling factor k. The coupling factor k is determined by the relative position of two transmission lines. Commonly, broad-side coupled transmission line has a lager k than the edge coupled lines. Furthermore, less the distance between two lines is, the larger k is.

Figure 5:
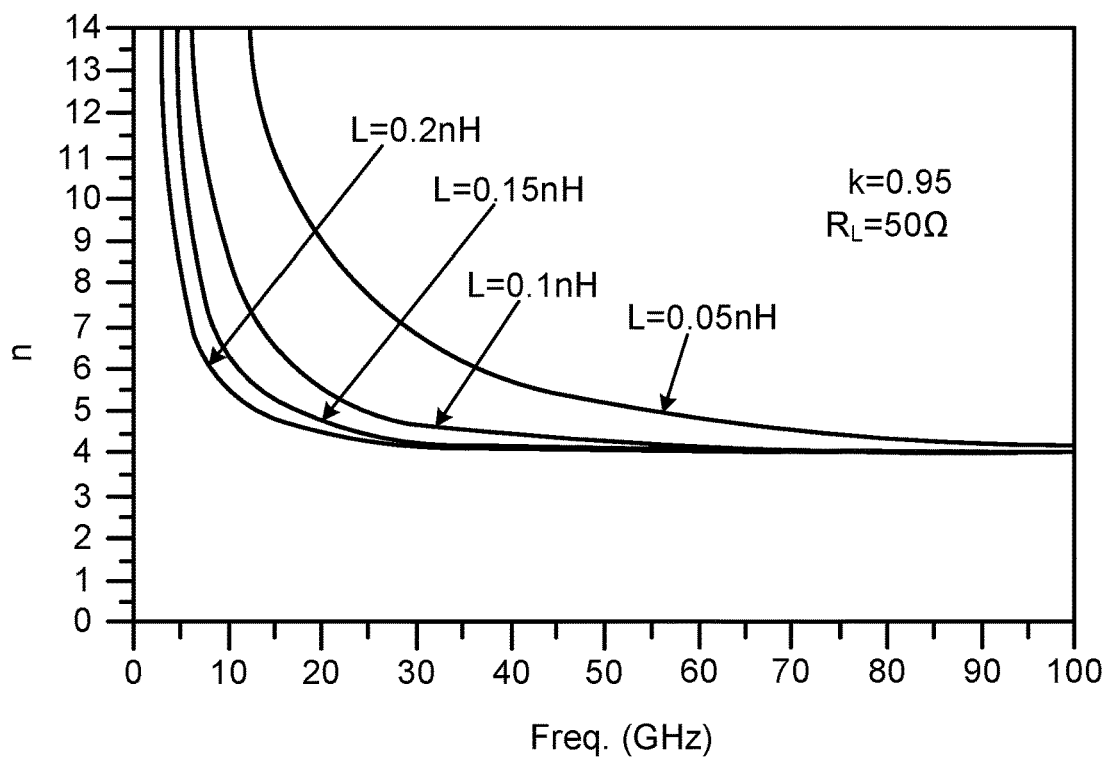

FIG. 5 shows the magnitude of the impedance transformation ratio n versus frequency at a ratio:

$$\frac{sL}{R_L}\frac{1}{f \cdot 10^{-11}} = \{0.63, 1.25, 1.88, 2.5\},$$

corresponding to L={0.05, 0.10, 0.15, 0.20} nH. Here, $R_L$=50Ω and k=0.95. The length and width of the transmission line determine the self-inductance $L_i$ (i=1, 2). It can be found that the impedance transformation ratio n increases with decreasing $$\frac{L}{R_L}.$$

Decreasing $L_i$ would reduce the shunt inductance (one inductor is grounded), thus, would reduce the impedance at port 2 (see, any of FIGS. 3a, 6a, 7a, 8a). This results in increasing the impedance transformation ratio. FIG. 5 shows also the frequency bandwidth of Ruthroff transformer increases with increasing $$\frac{L}{R_L}.$$

The separation of the coupled transmission lines, as well as the length and width of the transmission lines can be optimized to get proper impedance transformation ratios within a certain frequency bandwidth.

Figure 6:
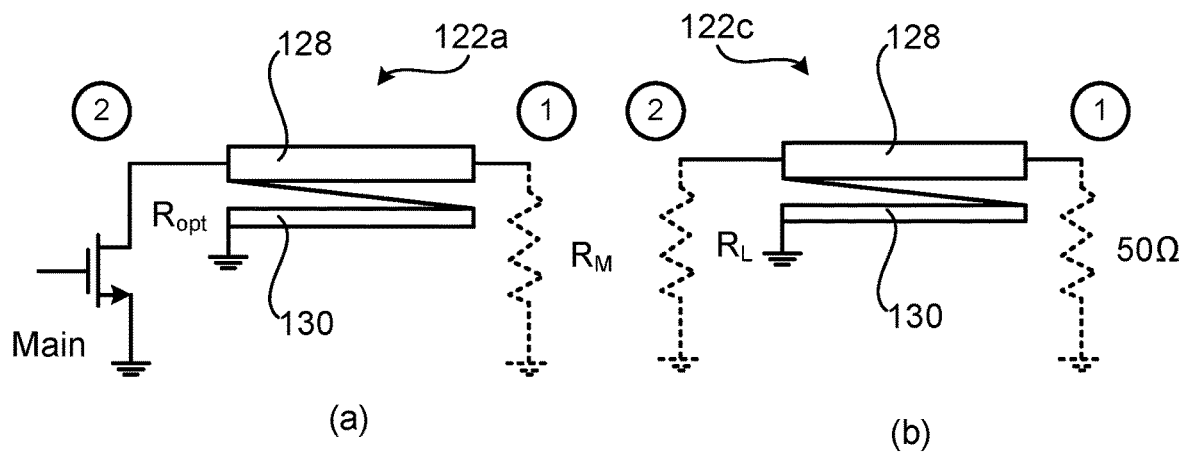

If the required impedance transformation ratio $R_M/R_{opt}$ and the ratio $50/R_L$, corresponding to the first and the $N^{th}$ Ruthroff transformer, as shown in FIG. 6(a) and FIG. 6(b), respectively, is larger than 4, either two cascaded Ruthroff transformers or one high-order Ruthroff transformer can be used. That is, according to an embodiment, each cascaded Ruthroff transformer consists of either only one single Ruthroff transformer 122a, 122b, 122c or two Ruthroff transformers 122a, 122b, 122c.

Figure 7:
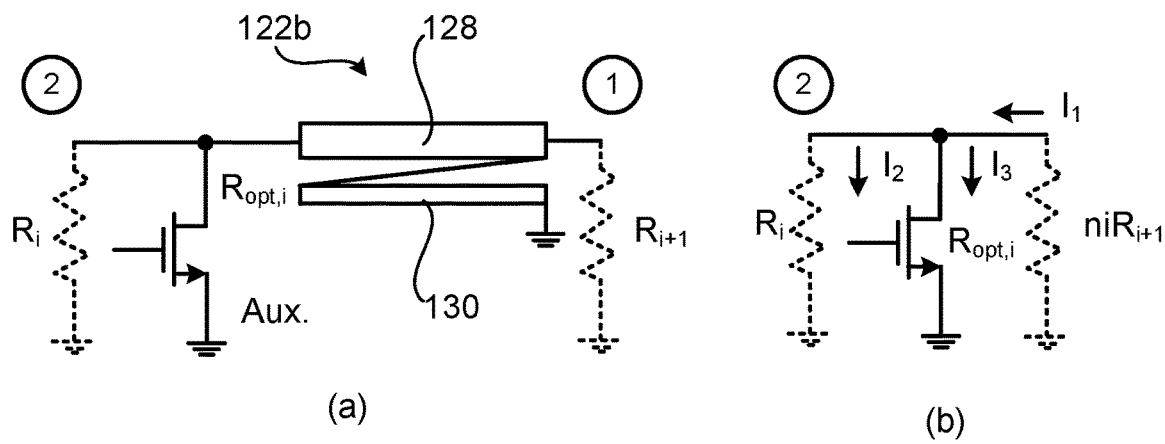

A section of the Doherty combiner for the auxiliary amplifiers (the $i^{th}$ Ruthroff transformer, i=2, 3, . . . , N−1) is shown in FIG. 7(a). $R_{i+1}$ is the impedance of port 1 and is the impedance of the adjacent section on the right side. $R_i$ is the impedance of port 2 and is the impedance of the adjacent section on the left side. The transistor connected to the high impedance side of the Ruthroff transformer should be matched to $R_{opt,i}$. The impedance at the high impedance port of the Ruthroff transformer is $n_i R_{i+1}$, as shown in FIG. 7(b), where $n_i$ is the impedance transformation ratio of the $i^{th}$ Ruthroff transformer. Thus:

$$\frac{1}{n_i R_{i+1}} = \frac{1}{R_i} + \frac{1}{R_{opt,i}} \tag{5}$$

From (5) yields:

$$R_{opt,i} = \frac{1}{\frac{1}{n_i R_{i+1}} - \frac{1}{R_i}} \tag{6}$$

Figure 8:
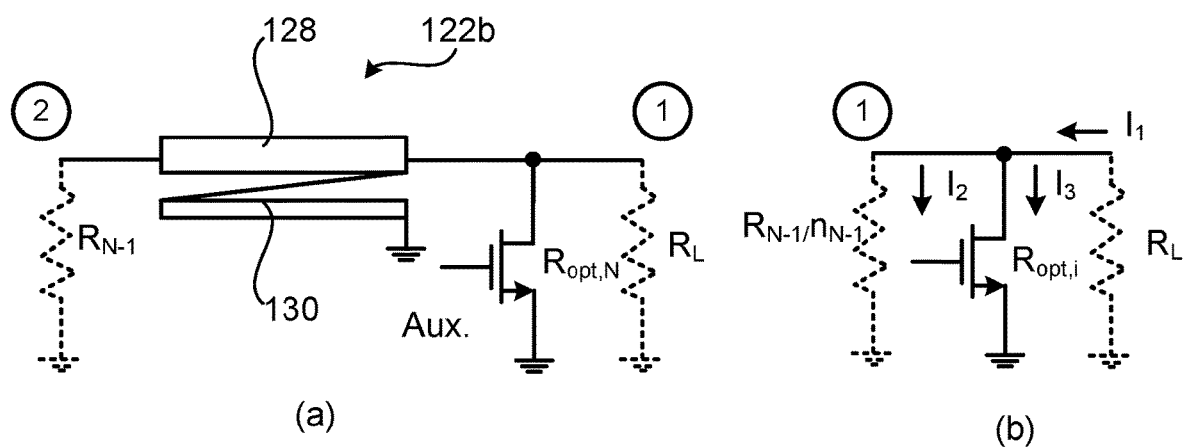

For the $(N-1)^{th}$ section, as shown in FIG. 8(a), the impedance of port 1 is $R_L$ and the impedance of port 2 is $R_{N-1}$. From equivalent circuit as shown in FIG. 8(b) is obtained:

$$\frac{1}{R_L} = \frac{n_{N-1}}{R_{N-1}} + \frac{1}{R_{opt,N}} \tag{7}$$

and $$R_{opt,N} = \frac{1}{\frac{1}{R_L} - \frac{n_{N-1}}{R_{N-1}}}, \tag{8}$$

where $n_{N-1}$ denotes the impedance transformation ratio of the $(N-1)^{th}$ Ruthroff transformer.

In summary, the admittance $Y_{opt}=1/R_{opt}$ of each auxiliary amplifier should be matched to the admittance difference between the neighboring Ruthroff transformers to guarantee that the auxiliary amplifiers deliver their maximum output power. The impedance matching for the auxiliary amplifiers is realized by tuning the impedance transformation ratios of the neighboring Ruthroff transformers. Moreover, the admittance at the low impedance port of the first Ruthroff transformer should be equal to $Y_{opt}$ of the main amplifier.

Figure 9:
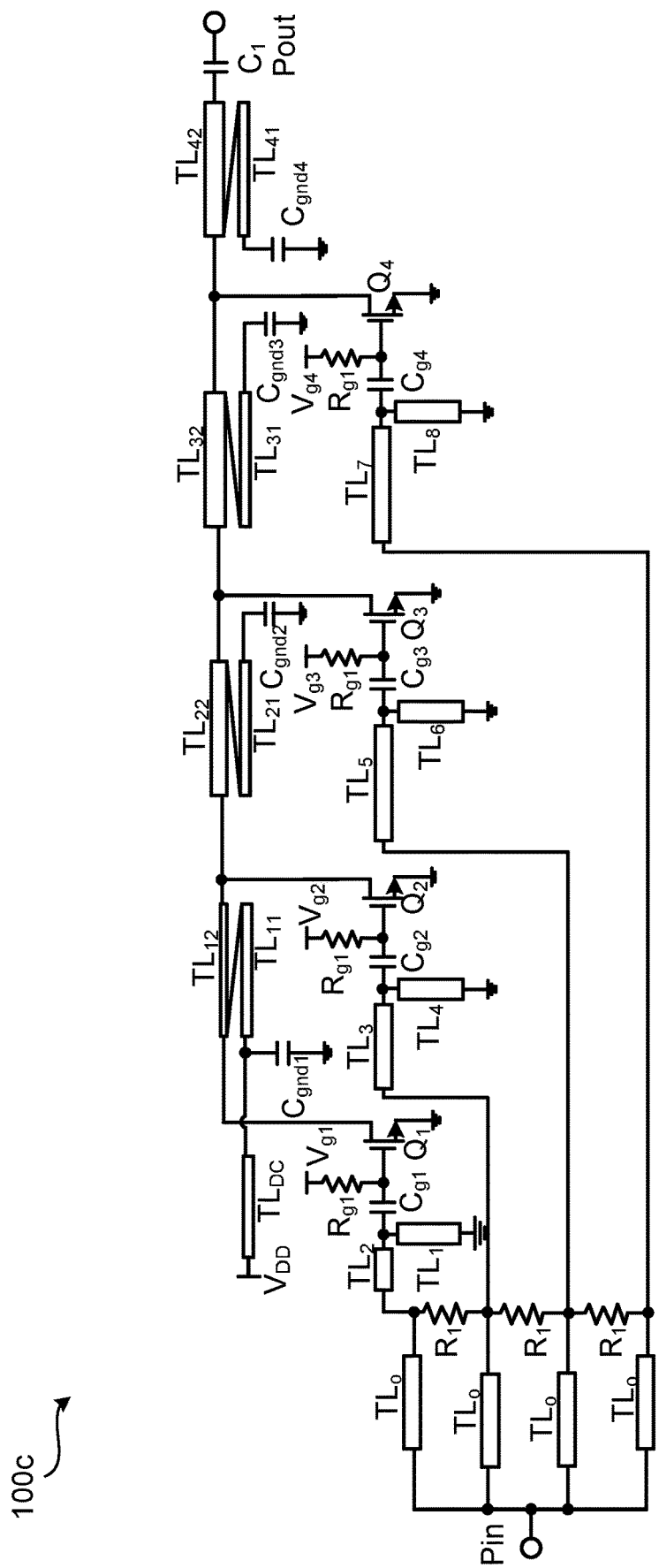

A power amplifier arrangement configured for operation in the frequency interval 26-42 GHz was designed using 60 nm GaN technology. Such a power amplifier arrangement covers the mm-wave frequency range of the fifth generation (5G) new radio (NR) air interface and has a relative bandwidth of 47%. The schematic of such a power amplifier arrangement woe is shown in FIG. 9. This power amplifier arrangement 100 has one main amplifier and three auxiliary amplifiers.

The Doherty power combiner comprises four Ruthroff transformers. Each Ruthroff transformer consists of two edge coupled transmission lines. one terminal of each Ruthroff transformer is grounded via a decoupling capacitor ($C_{gnd,i}$, i=1, 2, 3, 4). A single drain voltage supplier, $V_{DD}$, for all transistors is connected with the AC grounded terminal via a transmission line, $TL_{DC}$. The AC-decoupling capacitors, as well as the capacitor $C_1$ at the output port, avoid DC power leakage to the output port and ground. The presented embodiment takes advantage of the simplicity in using a single supply voltage. However, if needed several supply voltages may be employed by inserting the appropriate AC blocking and AC-coupling capacitors The input power is divided into four parts, added at the inputs of all transistors separately. Transmission lines, $TL_2$, $TL_3$, $TL_5$ and $TL_7$ control the phases of the input signals so that the outputs of the transistors are combined in-phase. Shunted transmission lines, $TL_1$, $TL_4$, $TL_6$ and $TL_8$, as well as capacitors $C_{g1}$, $C_{g2}$, $C_{g3}$, and $C_{g4}$ form impedance matching networks for the input of the transistors.

Figure 10:
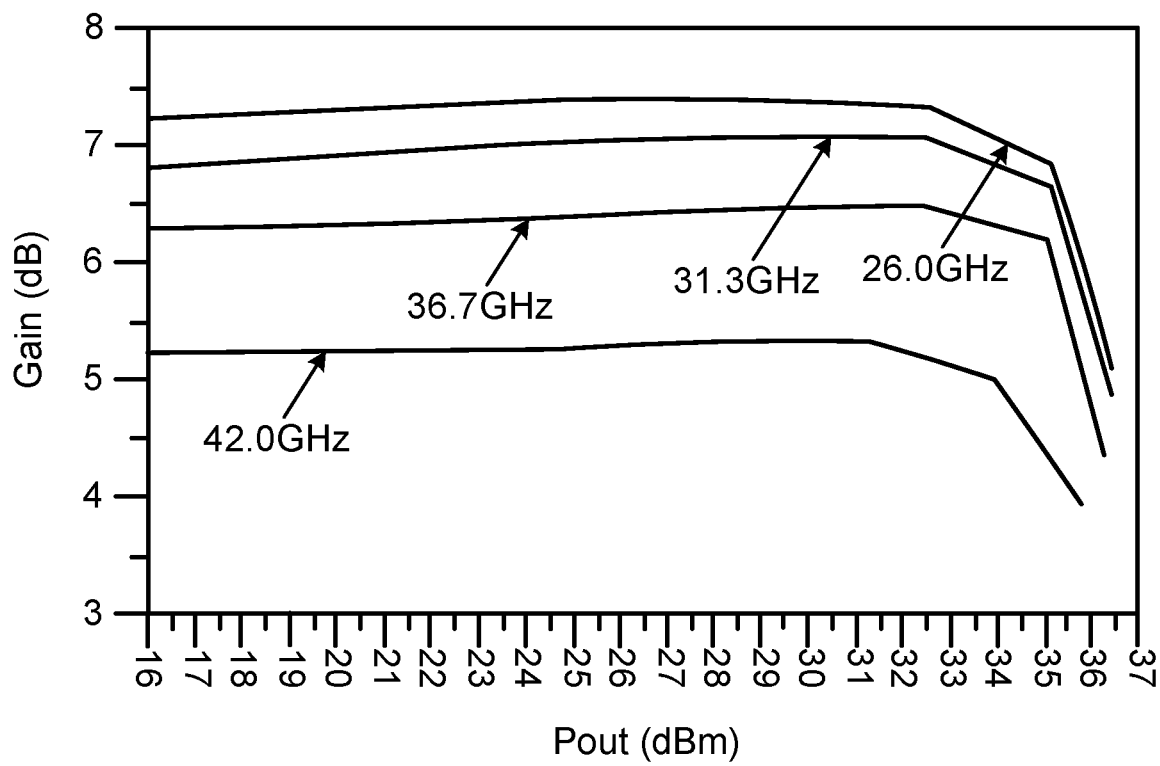
Figure 11:
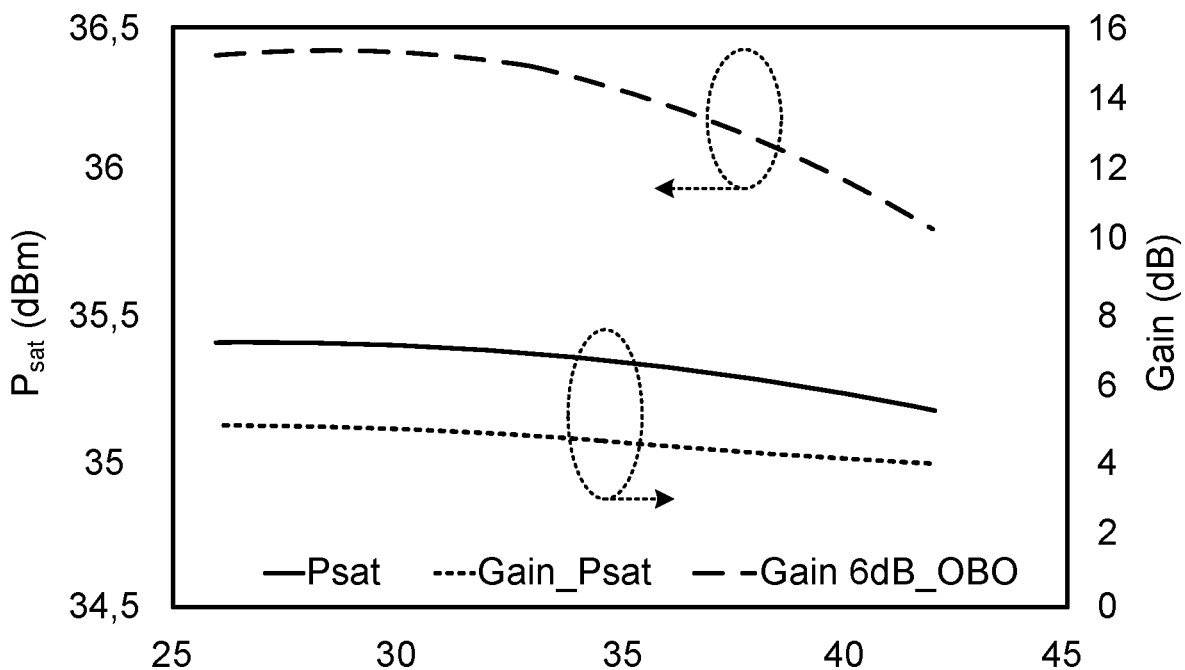

FIG. 10 plots the gain of the power amplifier arrangement versus the output powers at frequencies 26 GHz, 31.3 GHz, 36.7 GHz, and 42.0 GHz. The small signal gain of the power amplifier arrangement is varied between 5.2 dB to 7.2 dB at different frequencies. The saturated output power of the power amplifier arrangement is around 36.5 dBm. Gain at the saturated output power and 6 dB OBO at different frequencies are plotted in FIG. 11. As the output power increases from 6 dB OBO up to the saturated output power, the gain decreases less than 2.5 dB, which indicates that the power amplifier arrangement has a good linearity.

Figure 12:
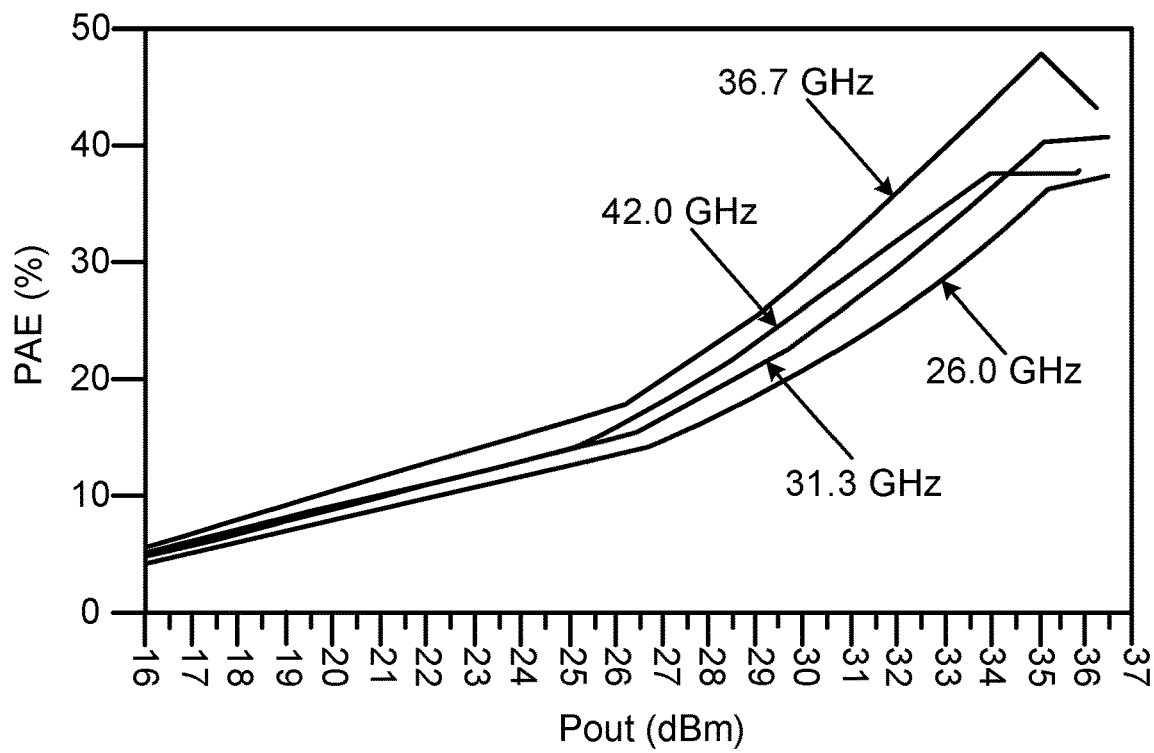
Figure 13:
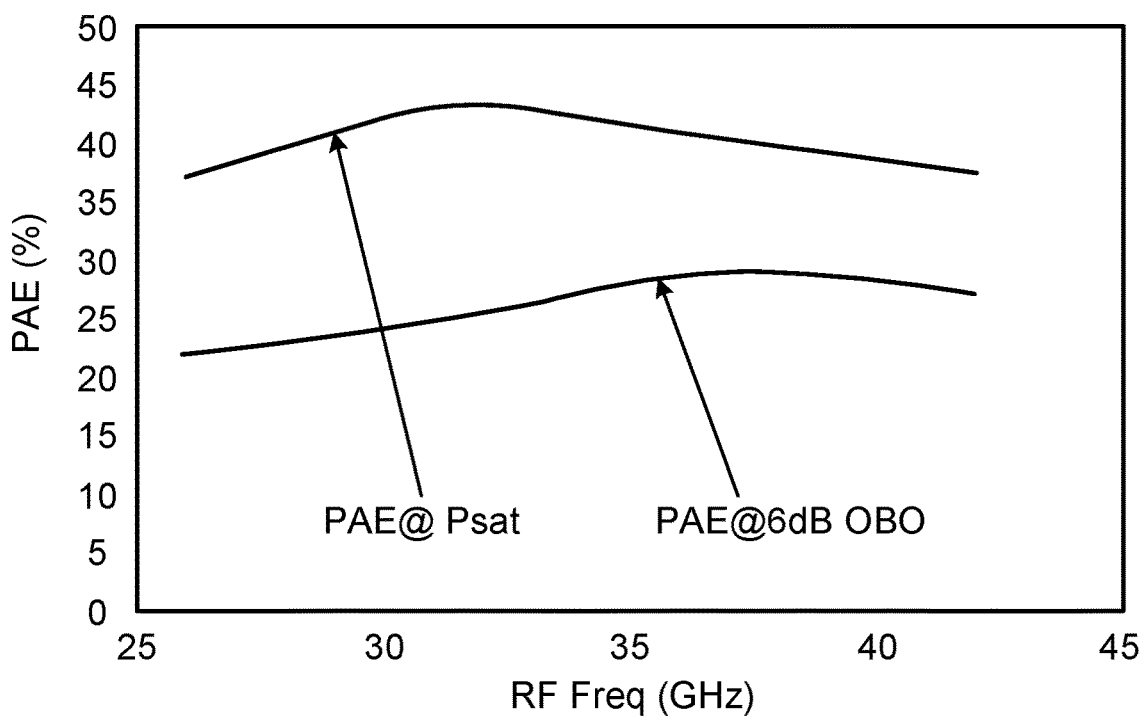

The PAEs of the power amplifier arrangement at frequencies 26 GHz, 31.3 GHz, 36.7 GHz, and 42.0 GHz are plotted in FIG. 12. The maximum PAEs varies between 36% to 47% at different frequencies. The PAE at saturated output power and 6 dB OBO are shown in FIG. 13.

Figure 14:
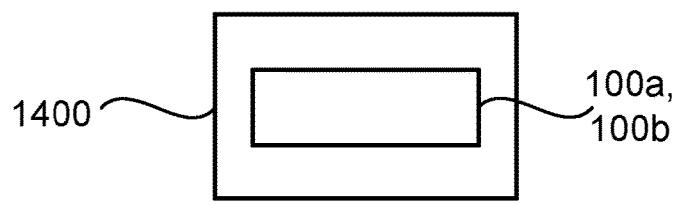
FIG. 14 schematically illustrates a radio transceiver device according to an embodiment.

The herein disclosed power amplifier arrangement 100a, 100b, 100c might be provided either as a standalone arrangement, or as part of a further device or arrangement. In particular, as illustrated in FIG. 14, in some aspects there is provided a radio transceiver device 1400 comprising at least one power amplifier arrangement 100a, 100b, 100c as herein disclosed. The radio transceiver 1400 might in turn be part of a radio base station (such as a radio access network node, base transceiver station, node B (NB), evolved node B (eNB), gNB, access point or transmission and reception point (TRP)). The radio transceiver 1400 might alternatively be part of a portable wireless device (such as mobile station, mobile phone, handset, wireless local loop phone, user equipment (UE), smartphone, laptop computer, tablet computer, modem, wireless sensor, network equipped vehicle, or Internet of Things (IoT) device).

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A power amplifier arrangement for amplifying an input power signal (Pin) to an output power signal (Pout), the power amplifier arrangement comprising:
   a main amplifier having an input and an output;
   at least one auxiliary amplifier, each having an input and an output;
   a power divider having an input and outputs, wherein the input of the power divider is configured to receive the input power signal (Pin), and wherein each output of the power divider is connected to a respective input of the main amplifier and the at least one auxiliary amplifier; and
   a Doherty combiner comprising at least one Ruthroff transformer and configured to combine all the outputs of the main amplifier and the at least one auxiliary amplifier to, at an output of the Doherty combiner, produce the output power signal (Pout), wherein one of the at least one Ruthroff transformer is configured to provide an upward impedance transformation.

2. The power amplifier arrangement according to claim 1, wherein one of the at least one Ruthroff transformer is connected between the output of said one of the at least one auxiliary amplifier and the output of the Doherty combiner.

3. The power amplifier arrangement according to claim 2, wherein the Ruthroff transformer connected to the output of the Doherty combiner is configured to provide an upward impedance transformation.

4. The power amplifier arrangement according to claim 1, wherein one of the at least one Ruthroff transformer is connected between the output of the main amplifier and the output of one of the at least one auxiliary amplifier.

5. The power amplifier arrangement according to claim 4, wherein the Ruthroff transformer connected to the main amplifier is configured to provide an upward impedance transformation.

6. The power amplifier arrangement according to claim 1, wherein the Doherty combiner comprises cascaded Ruthroff transformers.

7. The power amplifier arrangement according to claim 6, wherein each cascaded Ruthroff transformer consists of either only one single Ruthroff transformer or two Ruthroff transformers.

8. The power amplifier arrangement according to claim 6, wherein there are as many cascaded Ruthroff transformer as there are main and auxiliary amplifiers in total.

9. The power amplifier arrangement according to claim 8, wherein the cascaded Ruthroff transformers are separated by junctions, wherein the output of the main amplifier is connected to the first cascaded Ruthroff transformer, and wherein the output of each auxiliary amplifier is connected to a respective one of the junctions between two neighboring cascaded Ruthroff transformers.

10. The power amplifier arrangement according to claim 9, wherein each cascaded Ruthroff transformer except the first cascaded Ruthroff transformer and the last cascaded Ruthroff transformer is configured to provide an upward impedance transformation.

11. The power amplifier arrangement according to claim 1, wherein each of the at least one Ruthroff transformer consists of two coupled transmission lines.

12. The power amplifier arrangement according to claim 11, wherein the two coupled transmission lines exhibit an impedance transformation ratio given by separation distance between the two coupled transmission lines as well as length and width of each transmission line, and wherein the impedance transformation ratio for each of the at least one Ruthroff transformer is selected according to an impedance matching criterion for the power amplifiers connected to said each of the at least one Ruthroff transformer.

13. The power amplifier arrangement according to claim 1, wherein the inputs of all the main amplifier and the at least one auxiliary amplifier are connected to the outputs of the power divider via respective phase delay lines to drive each amplifier in terms of phase and amplitude.

14. The power amplifier arrangement according to claim 1, further comprising:
   an impedance matching network, wherein the impedance matching network is connected between the output of one of the at least one auxiliary amplifier and the output of the Doherty combiner.

15. A radio transceiver device comprising at least one power amplifier arrangement according to claim 1.

16. The power amplifier arrangement according to claim 11, wherein the two coupled transmission lines exhibit an impedance transformation ratio given by separation distance between the two coupled transmission lines as well as length and width of each transmission line.

17. The power amplifier arrangement according to claim 1, wherein the at least one Ruthroff transformer includes a first Ruthroff transformer and a second Ruthroff transformer, the first Ruthroff transformer is configured to provide an upward impedance transformation, and the second Ruthroff transformer is not configured to provide an upward impedance transformation.

* * * * *